(12) United States Patent
Chuang et al.

(10) Patent No.: US 6,590,269 B1
(45) Date of Patent: Jul. 8, 2003

(54) PACKAGE STRUCTURE FOR A PHOTOSENSITIVE CHIP

(75) Inventors: Jason Chuang, Hsinchu Hsien (TW); Allis Chen, Hsinchu Hsien (TW); Jachson Hsieh, Hsinchu Hsien (TW); Hsiu Wen Tu, Hsinchu Hsien (TW); Meng Ru Tsai, Hsinchu Hsien (TW); Mon Nan Ho, Hsinchu Hsien (TW); Fu Yung Huang, Hsinchu Hsien (TW); Yung Sheng Chiu, Hsinchu Hsien (TW); Jichen Wu, Hsinchu Hsien (TW); Chih Cheng Hsu, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 0 days.

(21) Appl. No.: 10/114,201

(22) Filed: Apr. 1, 2002

(51) Int. Cl.[7] ............................................ H01L 31/0203
(52) U.S. Cl. ........................ 257/432; 257/704; 257/783
(58) Field of Search ................................. 257/704, 783, 257/713, 719

(56) References Cited

U.S. PATENT DOCUMENTS

| 4,972,089 A | * | 11/1990 | Stevenson | 250/551 |
|---|---|---|---|---|
| H1153 H | * | 3/1993 | August et al. | 257/704 |
| 5,256,901 A | * | 10/1993 | Ohashi et al. | 257/680 |
| 5,293,069 A | * | 3/1994 | Kato et al. | 257/698 |
| 5,324,888 A | * | 6/1994 | Tyler et al. | 257/678 |
| 6,057,597 A | * | 5/2000 | Farnworth et al. | 257/710 |
| 2002/0060287 A1 | * | 5/2002 | Ho et al. | 250/239 |

* cited by examiner

Primary Examiner—Jasmine J B Clark
(74) Attorney, Agent, or Firm—Pro-Techtor-Inter-National Services

(57) ABSTRACT

A package structure for a photosensitive chip includes a substrate having an upper surface and a lower surface, and a frame layer having a first surface and a second surface. The frame layer is formed on the substrate by way of injection molding with the first surface contacting the upper surface. A cavity is formed between the substrate and the frame layer. The second surface is formed with a depression in which plural projections each having a suitable height are formed. The frame layer is formed directly on the substrate by way of injection molding. The package structure further includes a photosensitive chip arranged within the cavity, a plurality of wires for connecting the substrate to the photosensitive chip, and a transparent layer rested on the projections within the depression. Accordingly, the yield can be improved and the manufacturing processes can be facilitated.

2 Claims, 4 Drawing Sheets

PACKAGE STRUCTURE FOR A PHOTOSENSITIVE CHIP

BACKGROUND OF THE INVENTION

1. Field of the Invention

The invention relates to a package structure for a photosensitive chip, and more specifically to a package structure for a photosensitive chip, which can be easily manufactured and possess high production yields.

2. Description of the Related Art

Referring to FIGS. 1 and 2, a conventional package structure for a photosensitive chip is manufactured according to the following steps. First, a substrate 10, on which traces 12 are formed to define a plurality of zones 17, is provided. Then, a plurality of photosensitive chips 13 are arranged on the plurality of zones 17. Next, a frame layer 14 formed with a plurality of slots 16 corresponding to the traces 12 is adhered onto the substrate 10 via an adhesive layer 15. At this time, the photosensitive chips 13 on the substrate 10 are exposed via the slots 16. Then, a plurality of wires 18 are provided to electrically connect the photosensitive chips 13 to the substrate 10. Next, the substrate 10 is cut into package bodies each includes the frame layer 14, as shown in FIG. 2. Then, as shown in FIG. 3, a single package body is placed within a jig 22, and a zone for receiving a transparent glass 20 is defined. Next, the transparent glass 20 covers the frame layer 14 to finish the package processes of the photosensitive chip 13.

There are some drawbacks in the conventional package structure for a photosensitive chip. Thus, the manufacturing processes are complicated, the yield of products is low, and the package cost is high. The drawbacks are described as follows.

1. Since the frame layer 14 has to be glued onto the substrate 10 by the glue layer and then cut into a plurality of package bodies, the gluing process has to be added and the frame layer 14 has to be treated as wasted material. Thus, the package cost is increased.

2. Since the surface of frame layer 14 to which the transparent glass 20 is glued is a flat surface, the transparent glass 20 cannot be positioned on the frame layer 14. Accordingly, the jig 22 has to be provided when the transparent glass is to be glued onto the frame layer 14 so as to define the zone for receiving the transparent glass 20. Thus, the package cost is also increased.

3. When the glue layer 24 is applied onto the frame layer 14 to glue the transparent glass 20, the amount of the applied glue layer 24 is not uniform. Thus, the glued transparent glass 20 may be uneven, and the yield of the products may be influenced.

4. The covering process of the transparent glass 20 is performed after both of the substrate 10 and the frame layer 14 are cut into package bodies. At this time, the wasted material (chip) may contaminate the photosensitive chips 13. Therefore, the yield of the photosensitive chips 13 may be influenced.

In view of these drawbacks, it is therefore an object of the invention to provide a package structure for a photosensitive chip capable of solving the drawbacks of the package structure for a photosensitive chip and making it more applicable.

SUMMARY OF THE INVENTION

It is therefore an object of the invention to provide a package structure for a photosensitive chip, which is capable of simplifying the package processes, saving the material and thus lowering the manufacturing cost.

Another object of the invention is to provide a package structure for a photosensitive chip capable of facilitating the covering process of the transparent glass so as to improve the production yield.

Still another object of the invention is to provide a package structure for a photosensitive chip capable of smoothly attaching the transparent glass onto the frame layer and improving the production yield.

To achieve the above-mentioned objects, the invention provides a package structure for a photosensitive chip. The package structure includes a substrate having an upper surface and a lower surface, and a frame layer having a first surface and a second surface. The frame layer is formed on the substrate by way of injection molding with the first surface contacting the upper surface. A cavity is formed between the substrate and the frame layer. The second surface is formed with a depression in which plural projections each having a suitable height are formed. The frame layer is formed directly on the substrate by way of injection molding. The package structure further includes a photosensitive chip arranged within the cavity, a plurality of wires for connecting the substrate to the photosensitive chip, and a transparent layer rested on the projections within the depression. Accordingly, the yield can be improved and the manufacturing processes can be facilitated.

DETAILED DESCRIPTION OF THE PREFERRED EMBODIMENT

Figure 1:
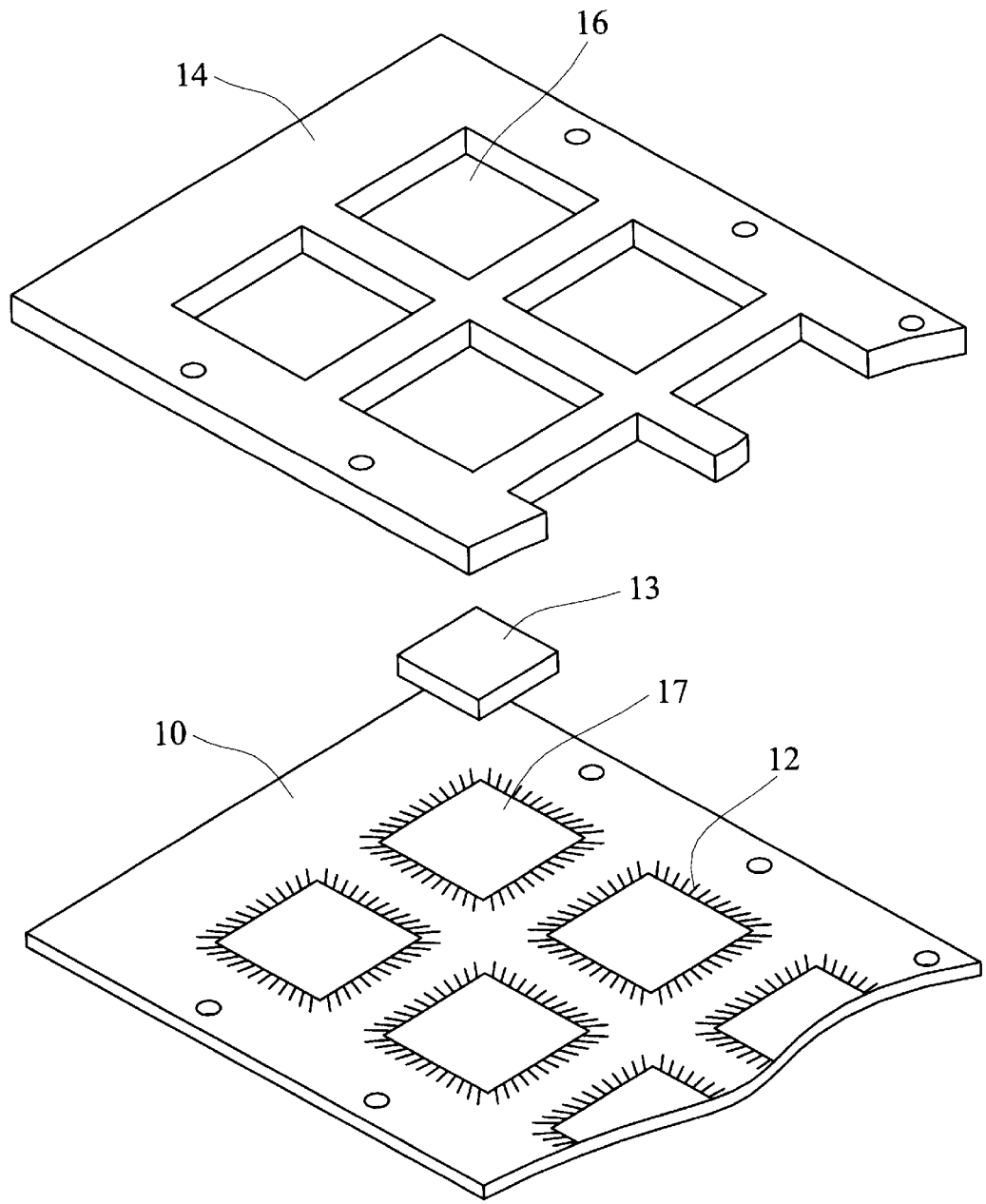
FIG. 1 is a pictorially exploded view showing a conventional package structure for a photosensitive chip.
Figure 2:
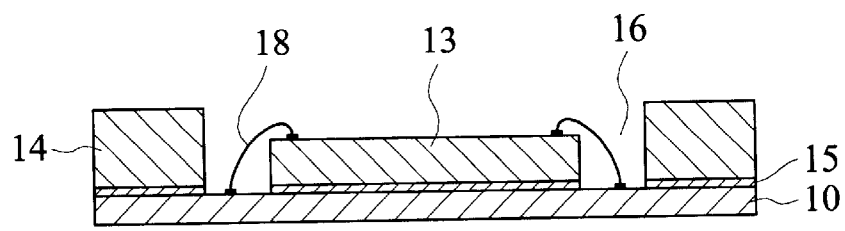
FIG. 2 is a schematic illustration showing a first cross-sectional view of the conventional package structure for a photosensitive chip in the manufacturing process.
Figure 3:
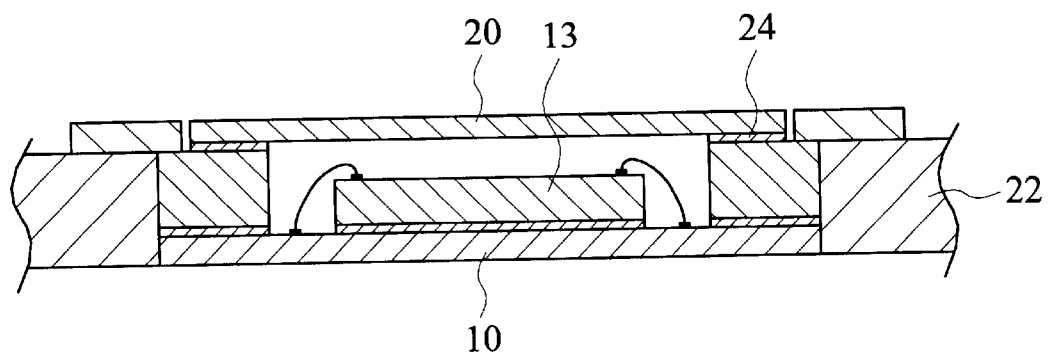
FIG. 3 is a schematic illustration showing a second cross-sectional view of the conventional package structure for a photosensitive chip in the manufacturing process.
Figure 4:
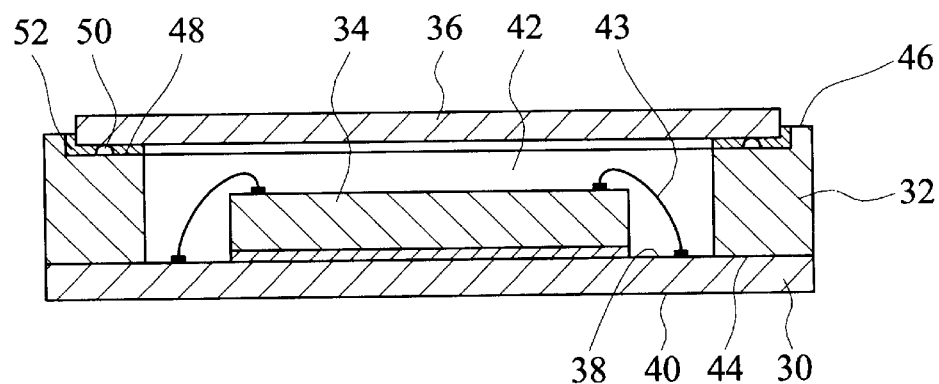
FIG. 4 is a cross-sectional view showing a package structure for a photosensitive chip of the invention.

Referring to FIG. 4, the package structure in accordance with one embodiment of the invention includes a substrate 30, a frame layer 32, a photosensitive chip 34 and transparent layer 36.

The substrate 30 has an upper surface 38 and a lower surface 40. The upper surface 38 is formed with a plurality of traces.

The frame layer 32 is a frame structure having a first surface 44 and a second surface 46 opposite to the first surface 44. In this embodiment, the frame layer 32 is directly formed on the substrate 30 by way of injection molding. A cavity 42 is formed between the frame layer 32 and the upper surface 38 of the substrate 30. The frame layer 32 is mounted on the upper surface 38 of the substrate 30 with the first surface 44 contacting the substrate 30. A depression 48 is formed at the second surface 46 in the injection molding process. A plurality of projections 50 each having a suitable height is also formed within the depression 48.

The photosensitive chip 34 is arranged within the cavity 42 and attached to the upper surface 38 of the substrate 30. A plurality of wires 43 are provided to electrically connect the photosensitive chip 34 to the substrate 30, so that the signals from the photosensitive chip 34 can be transmitted to the substrate 30.

The transparent layer 36 may be a piece of transparent glass, which is attached onto the depression 48 formed in the frame layer 32 by a glue layer 52. The transparent layer 36 is effectively attached onto the frame layer 32 and rested on the projections 50 within the depression 48. Thus, the transparent layer 36 can smoothly cover the photosensitive chip 34.

Figure 5:
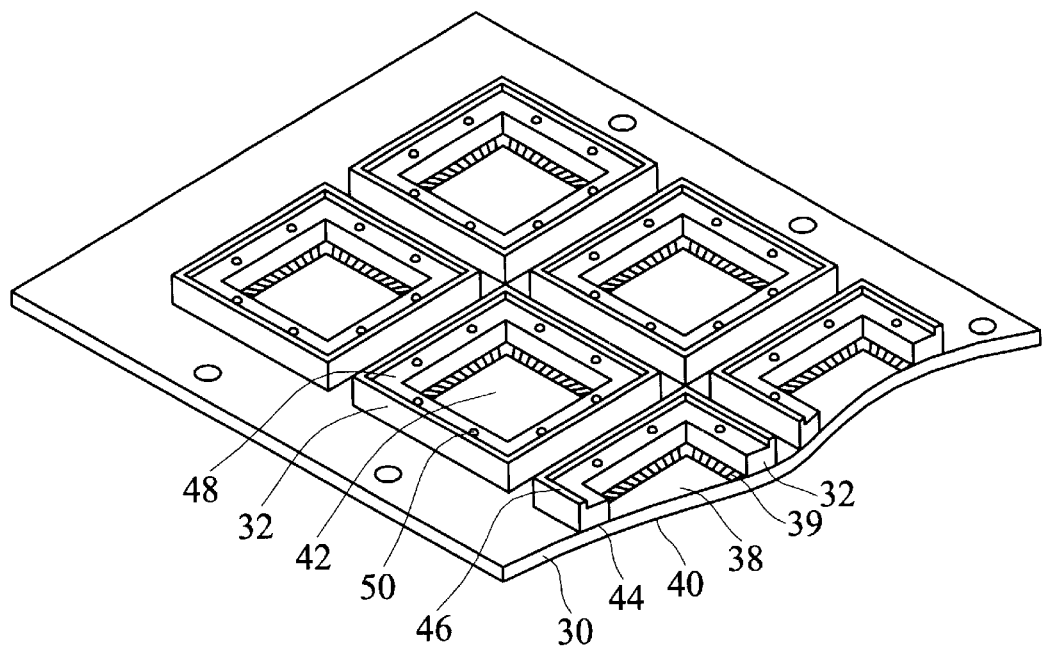
FIG. 5 is a pictorial view showing a substrate formed by way of injection molding in the package structure for photosensitive chips of the invention.

During the manufacturing processes, as shown in FIG. 5, on the upper surface 38 of the substrate 30 is formed with traces 39 defining a plurality of zones. Then, a plurality of frame layers 32 are formed, by way of injection molding, in the plurality of zones defined by the traces 39 formed on the upper surface 38 of the substrate 30. Accordingly, a cavity 42 is formed between each frame layer 32 and the upper surface 38 of the substrate 30. Meanwhile, depressions 48 are formed on the second surface 46 of the frame layer 32, and projections 50 each having a suitable height are formed within each depression 48.

Figure 6:
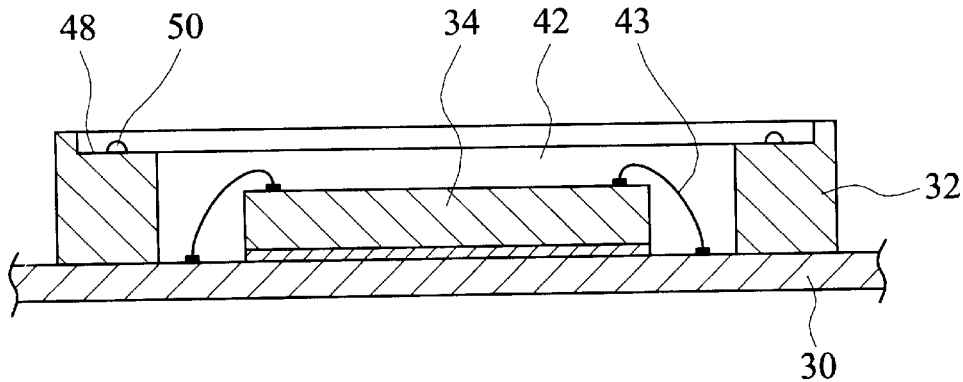
FIG. 6 is a schematic illustration showing a first cross-sectional view of the package structure for a photosensitive chip of the invention in the manufacturing process.

As shown in FIG. 6, the photosensitive chips 34 are arranged within the cavities 42, respectively, and are attached onto the upper surface 38 of the substrate 30. Then, a plurality of wires 43 are provided to electrically connect the photosensitive chips 34 to the substrate 30, respectively.

Figure 7:
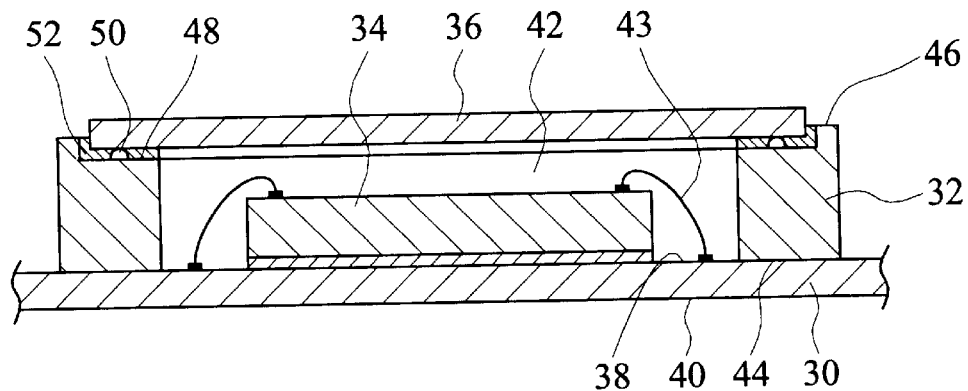
FIG. 7 is a schematic illustration showing a second cross-sectional view of the package structure for a photosensitive chip of the invention in the manufacturing process.

Subsequently, as shown in FIG. 7, a plurality of transparent layers 36 are arranged within the depressions 48 coated with glue layers 52, respectively. When the transparent layers 36 are placed to cover the depressions 48, the glue layers 52 are forced to uniform diffuse over the depressions 48. Thus, the transparent layers 36 are effectively adhered onto the frame layers 32 and rested on the projections 50 within the depressions 48. Accordingly, the transparent layers 36 can smoothly cover the photosensitive chips 34. Finally, the packaged photosensitive chips are cut into a plurality of individual package factures, as shown in FIG. 4.

According to the above-mentioned structure, the invention possesses the following advantages.

1. Since the frame layers 32 are formed on the substrate 30 by way of injection molding, the gluing process in the prior art can be omitted to simplify the manufacturing processes. Furthermore, the adhesive reliability between the frame layers 32 and the substrate 30 is better than that in the prior art.

2. Since the frame layers 32 are directly formed by way of injection molding, the material can be saved so that the manufacturing cost may be lowered.

3. Forming the depressions 48 each having a suitable size on the second surface 46 of the frame layer 32, it is convenient to directly place the transparent layers 36 within the depressions 48. Thus, no jig has to be used to guide the placements of the transparent layers 36, thereby facilitating the covering process. In addition, the covering process can be performed on a piece of substrate 30 without the inconvenience caused by the cutting process followed by the covering process in the prior art.

4. When being placed within the depressions 48 formed with the projections 50, the transparent layers 36 are rested on the projections 50 and the glue layers 52 may evenly diffuse over the depressions 48. Accordingly, the transparent layers 36 may smoothly cover the frame layers 32 so that package bodies with better qualities can be obtained.

5. Since the cutting process of the substrate 30 is performed only after the covering process of the transparent layers 36, the waste material is free from being left on the photosensitive chips 34. Thus, package bodies with better qualities can be obtained.

While the invention has been described by way of an example and in terms of a preferred embodiment, it is to be understood that the invention is not limited to the disclosed embodiment. To the contrary, it is intended to cover various modifications. Therefore, the scope of the appended claims should be accorded the broadest interpretation so as to encompass all such modifications.

What is claimed is:

1. A package structure for a photosensitive chip, comprising:
   a substrate having an upper surface and a lower surface opposite to the upper surface;
   a frame layer having a first surface and a second surface opposite to the first surface, the frame layer being formed on the substrate with the first surface contacting the upper surface of the substrate, so as to form a cavity together with the substrate;
   a photosensitive chip placed on the upper surface of the substrate and within the cavity;
   a plurality of wires for electrically connecting the substrate to the photosensitive chip; and
   a transparent layer arranged on the frame layer to cover the photosensitive chip, wherein the second surface of the frame layer is formed with a depression in which the transparent layer is placed to cover the photosensitive chip.

2. The package structure according to claim 1, further comprising a plurality of projections each having a suitable height and formed within the depression of the frame layer.

* * * * *

(12) EX PARTE REEXAMINATION CERTIFICATE (8359th)
United States Patent
Chuang et al.

(10) Number: US 6,590,269 C1
(45) Certificate Issued: Jun. 28, 2011

(54) PACKAGE STRUCTURE FOR A PHOTOSENSITIVE CHIP

(75) Inventors: Jason Chuang, Hsinchu Hsien (TW); Allis Chen, Hsinchu Hsien (TW); Jachson Hsieh, Hsinchu Hsien (TW); Hsiu Wen Tu, Hsinchu Hsien (TW); Meng Ru Tsai, Hsinchu Hsien (TW); Mon Nan Ho, Hsinchu Hsien (TW); Fu Yung Huang, Hsinchu Hsien (TW); Yung Sheng Chiu, Hsinchu Hsien (TW); Jichen Wu, Hsinchu Hsien (TW); Chih Cheng Hsu, Hsinchu Hsien (TW)

(73) Assignee: Kingpak Technology Inc., Chupei, Hsinchu Hsien (TW)

Reexamination Request:
No. 90/011,061, Jun. 30, 2010

Reexamination Certificate for:
Patent No.: 6,590,269
Issued: Jul. 8, 2003
Appl. No.: 10/114,201
Filed: Apr. 1, 2002

(51) Int. Cl.
*H01L 31/0203* (2006.01)

(52) U.S. Cl. .......... 257/432; 257/704; 257/783; 257/E31.118

(58) Field of Classification Search .................. None
See application file for complete search history.

(56) References Cited

U.S. PATENT DOCUMENTS

| 3,622,419 A | 11/1971 | London |
| 5,122,861 A | 6/1992 | Tamura et al. |
| 6,262,479 B1 | 7/2001 | Chou |

*Primary Examiner*—Erik Kielin

(57) ABSTRACT

A package structure for a photosensitive chip includes a substrate having an upper surface and a lower surface, and a frame layer having a first surface and a second surface. The frame layer is formed on the substrate by way of injection molding with the first surface contacting the upper surface. A cavity is formed between the substrate and the frame layer. The second surface is formed with a depression in which plural projections each having a suitable height are formed. The frame layer is formed directly on the substrate by way of injection molding. The package structure further includes a photosensitive chip arranged within the cavity, a plurality of wires for connecting the substrate to the photosensitive chip, and a transparent layer rested on the projections within the depression. Accordingly, the yield can be improved and the manufacturing processes can be facilitated.

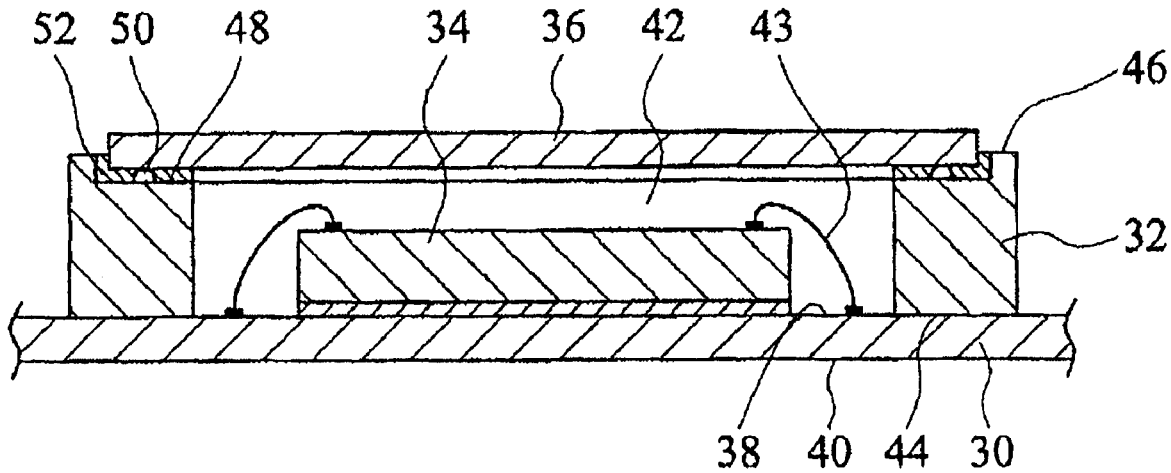

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is cancelled.

Claim 2 is determined to be patentable as amended.

2. [The] *A* package structure [according to claim 1, further] *for a photosensitive chip*, comprising*:* a *substrate having an upper surface and a lower surface opposite to the upper surface;*

*a frame layer having a first surface and a second surface opposite to the first surface, the frame layer being formed on the substrate with the first surface contacting the upper surface of the substrate, so as to form a cavity together with the substrate;*

*a photosensitive chip placed on the upper surface of the substrate and within the cavity; a plurality of wires for electrically connecting the substrate to the photosensitive chip;*

*a transparent layer arranged on the frame layer to cover the photosensitive chip, wherein the second surface of the frame layer is formed with a depression in which the transparent layer is placed to cover the photosensitive chip; and* a plurality of projections each having a suitable height and formed within the depression of the frame layer.

* * * * *